US011187222B2

(12) United States Patent
Galtry et al.

(10) Patent No.: US 11,187,222 B2
(45) Date of Patent: Nov. 30, 2021

(54) VACUUM PUMPING ARRANGEMENT (71) Applicant: Edwards Limited, Burgess Hill (GB)

(72) Inventors: Michael Andrew Galtry, Worthing (GB); Christopher Mark Bailey, Horsham (GB)

(73) Assignee: Edwards Limited, Burgess Hill (GB)

( * ) Notice: Subject to any disclaimer, the term of this patent is extended or adjusted under 35 U.S.C. 154(b) by 49 days.

(21) Appl. No.: 16/462,615

(22) PCT Filed: Nov. 23, 2017

(86) PCT No.: PCT/GB2017/053524
§ 371 (c)(1),
(2) Date: May 21, 2019

(87) PCT Pub. No.: WO2018/100342
PCT Pub. Date: Jun. 7, 2018

(65) Prior Publication Data
US 2020/0080549 A1 Mar. 12, 2020

(30) Foreign Application Priority Data

Nov. 29, 2016 (GB) ..................................... 1620225

(51) Int. Cl.
F04B 41/06 (2006.01)
F04D 19/04 (2006.01)
(Continued)

(52) U.S. Cl.
CPC .............. F04B 41/06 (2013.01); F04B 37/14 (2013.01); F04B 49/007 (2013.01); F04B 49/22 (2013.01);
(Continued)

(58) Field of Classification Search
CPC ........ F04B 37/14; F04B 41/06; F04B 49/007; F04B 49/22; F04D 15/0005; F04D 15/0072; F04D 19/04; F04D 19/046
See application file for complete search history.

(56) References Cited

U.S. PATENT DOCUMENTS 5,733,104 A * 3/1998 Conrad ................. F04D 19/046
417/202
2005/0147509 A1 7/2005 Bailey et al.
(Continued)

FOREIGN PATENT DOCUMENTS

CN 201900731 U 7/2011
CN 203752475 U 8/2014
(Continued)

OTHER PUBLICATIONS

Translation of the Notification of First Office Action from counterpart Chinese Application No. 201780084973.X, dated Mar. 18, 2020, 11 pp.
Written Opinion of the International Searching Authority and International Search Report dated Feb. 8, 2018 from counterpart International Application No. PCT/GB2017/053524, 10 pp.
(Continued)

Primary Examiner — Patrick Hamo
(74) Attorney, Agent, or Firm — Shumaker & Sieffert, P.A.

(57) ABSTRACT

A vacuum pumping arrangement comprises a first pump which has a first inlet and a first outlet. The first inlet is fluidly connected to a first common pumping line. The first common pumping line includes a plurality of first pumping line inlets each of which is fluidly connectable to a least one process chamber within a group of process chambers that form a semiconductor fabrication tool. The vacuum pumping arrangement also includes a reserve pump which has a reserve inlet and a reserve outlet. The reserve inlet is selectively fluidly connectable to each process chamber within the group of process chambers that form the semiconductor fabrication tool. The vacuum pumping arrange-
(Continued)

ment additionally includes a controller which is configured to selectively fluidly isolate the pump from one or more given process chambers and selectively fluidly connect the reserve pump with the said one or more given process chambers.

18 Claims, 2 Drawing Sheets

(51) Int. Cl.
*F04B 37/14* (2006.01)
*F04B 49/00* (2006.01)
*F04B 49/22* (2006.01)
*H01L 21/67* (2006.01)
*F04D 15/00* (2006.01)

(52) U.S. Cl.
CPC ..... *F04D 15/0005* (2013.01); *F04D 15/0072* (2013.01); *F04D 19/04* (2013.01); *F04D 19/046* (2013.01); *H01L 21/67017* (2013.01)

(56) References Cited

U.S. PATENT DOCUMENTS

| | | | |
|---|---|---|---|
| 2017/0200622 A1* | 7/2017 | Shiokawa | H01L 21/67276 |
| 2017/0350395 A1* | 12/2017 | Schofield | F04C 25/02 |
| 2018/0112666 A1 | 4/2018 | Dreifert et al. | |

FOREIGN PATENT DOCUMENTS

| | | |
|---|---|---|
| CN | 105570094 A | 5/2016 |
| DE | 202015004596 U1 | 10/2015 |
| GB | 2533933 A | 7/2016 |
| JP | 2015227618 A | 12/2015 |
| JP | 2016183576 A | 10/2016 |
| WO | 2015182699 A1 | 12/2015 |
| WO | 2016110694 A1 | 7/2016 |

OTHER PUBLICATIONS

Combined Search and Examination Report under Sections 17 and 18(3) dated Mar. 30, 2017 from counterpart GB Application No. 1620225.1, 7 pp.
Translation of the Reason for Rejection from counterpart Japanese Application No. 2019-548776, dated Aug. 2, 2021, 6 pp.

* cited by examiner

VACUUM PUMPING ARRANGEMENT

This application is a national stage entry under 35 U.S.C. § 371 of International Application No. PCT/GB2017/053524, filed Nov. 23, 2017, which claims the benefit of GB Application 1620225.1, filed Nov. 29, 2016. The entire contents of International Application No. PCT/GB2017/053524 and GB Application 1620225.1 are incorporated herein by reference.

TECHNICAL FIELD

This disclosure relates to a vacuum pumping arrangement for evacuating a plurality of vacuum chambers and a fabrication assembly comprising such a vacuum pumping arrangement.

BACKGROUND

The vacuum chambers may form processing chambers of a fabrication tool assembly, which may be a semi-conductor fabrication tool assembly e.g. for the manufacture of silicon chips, flat panel displays, solar panels and light emitting diodes (LEDs). Processing in the vacuum chambers requires vacuum pressure generated by the vacuum pumping arrangement. The fluids evacuated by the vacuum pumping arrangement are typically processing gasses.

SUMMARY

According to a first aspect of the disclosure there is provided a vacuum pumping arrangement for evacuating a plurality of process chambers of a fabrication assembly, comprising:

a first pump having a first inlet and a first outlet, the first inlet being selectively, fluidly connected to a first common pumping line, the first common pumping line including a plurality of first pumping line inlets each of which is fluidly connectable to a process chamber within a group of process chambers forming such a fabrication assembly;

a reserve pump having a reserve inlet and a reserve outlet, the reserve inlet of the reserve pump being selectively fluidly connected to a reserve common pumping line, the reserve common pumping line including a plurality of reserve pumping line inlets each inlet being selectively fluidly connectable to a process chamber, thereby forming respective sets of first and reserve pumping line inlets interconnected by a valve module which, in turn, is fluidly connectable to at least one process chamber;

a first fluid connection between the first common pumping line and the reserve pump inlet; and a controller configured for selectively, fluidly connecting each of the first pump and the reserve pump with the, or each, process chamber, and for selectively fluidly connecting the reserve pump to the first common pumping line.

Other preferred or optional aspects of the disclosure are defined in the accompanying claims.

In embodiments of the disclosure described hereinafter, the provision of a first common pumping line which is fluidly connectable to each of a plurality of process chambers within a group of process chambers allows a first, dedicated pumping arrangement, which may comprise a single pump or may comprise multiple pumps operating in combination, to service all of the process chambers of a given fabrication tool, and thereby reduces both the capital cost of installing the vacuum pumping arrangement of the disclosure, as well as the on-going running costs, compared to those associated with a conventional vacuum pumping arrangement.

Meanwhile, the inclusion of respective pairs or sets of first and reserve pumping line inlets interconnected by a valve module which, in turn, is fluidly connectable to a process chamber allows a reserve pump, when required, to perform a dedicated pumping function for any one or more of the chambers. The reserve pump may have similar or different pumping characteristics to the first pump. In this regard a reserve pump may be configured for pumping a process chamber down from atmospheric pressure, so as to reduce the duty cycle of the first pump and thereby reduce the likelihood of the first pump failing. While the reserve pump is pumping down the chamber in this way, the first pump is able to maintain a stable pressure in the remaining processing chambers. Otherwise, it may be necessary to be stop processing in the remaining chambers while this chamber is pumped down by the first pump.

In addition, the inlets of the first pump and the reserve pump may be fluidly connected so that the reserve pump is able to take over the pumping function of the first pump (e.g. in the event that the first pump suffers a breakdown or reduction in capacity). Thus the overall reliability of the vacuum pumping arrangement can be maintained.

Optionally, the reserve inlet of the reserve pump is fluidly connected to the first common pumping line by valves. Such an arrangement provides a straightforward way of allowing the reserve pump to substitute for the first pump in the event that a failure condition is experienced by the first pump. In other examples the reserve pump may be connected to the inlet of the first pump by-passing the common pumping lines or may be connected to the first common pumping line by-passing the reserve common pumping line.

Since in examples of the disclosure respective sets or pairs of first and reserve pumping line inlets may be fluidly interconnected by a valve module which in turn may be fluidly connectable to the at least one process chamber, any one or more of the chambers can be evacuated either by the first or the reserve pump.

The inclusion of a valve module reduces the amount of pipeline required between the valve module or any of the corresponding process chambers and so provides a commensurate installation cost saving.

Conveniently, the first outlet of the first pump is fluidly connected to a first abatement module and the reserve outlet of the reserve pump may be arranged in selectable fluid communication with the first abatement module.

Fluidly connecting the reserve outlet of the reserve pump with the first abatement module allows the first abatement module to remove any unwanted material from the process flow generated by the reserve pump when it has taken over the pumping function of the first pump. It is preferable that fluid connection between the reserve pump and abatement module is selective, for example using a valve, because it is desirable or required not to mix the exhaust lines when the reserve is pumping down. In this regard, it is not desirable to pump large amounts of gas through the abatement module and certain mixtures of significant quantities of gases, such as an air and hydrogen mixture may not be safe.

In another example, there may be a second pump having a second inlet and a second outlet, the second inlet being fluidly connected to a second common pumping line, the second common pumping line including a plurality of second pumping line inlets each of which is fluidly connectable to a least one process chamber within the group of process chambers forming the semiconductor fabrication tool the second pump and the second common pumping line in use handling cleaning process flows; wherein respective sets or trios of first, second and reserve pumping line inlets are fluidly interconnected by a valve module which in turn is fluidly connectable to process chambers. There may be a fluid connection between the second common pumping line and the reserve pump inlet and a controller configured to selectively fluidly isolate each of the first and second pumps from one or more given process chambers and selectively fluidly connect the reserve pump with the one or more given process chambers, and for selectively fluidly connecting the reserve pump and the second common pumping line.

The inclusion of first and second pumps and associated first and second common pumping lines provides further improved efficiency from cost and space utilisation perspectives, while permitting optimisation of the respective pump according to the nature of the process flow passing therethrough and thereby providing further efficiency savings.

In the meantime the inclusion of a reserve pump which is able to function in place of either of the first or second pump provides the vacuum pumping arrangement with a degree of redundancy, e.g. in the event of a breakdown of either of the first or second pumps, whereby the reliability of the arrangement is maintained and any on-going semiconductor fabrication process is able to continue.

The reserve inlet of the reserve pump is fluidly connected to at least one of: the first common pumping line; the second common pumping line; and the reserve common pumping line. The reserve common pumping line includes a plurality of reserve pumping line inlets each of which is fluidly connectable to a least one process chamber.

Each of the foregoing arrangements is readily implementable within a practical semiconductor fabrication assembly.

It should be noted that each notional first and second pump may comprise a plurality of pumps, any one of which may experience a failure condition. Such a failure condition would result in reduced capacity of the overall notional first pump. Thus reduced capacity can be addressed/mitigated by isolating the failed pump from the respective common pumping line and connecting the reserve pump thereto. In this case, it should be further noted that references to the first inlet of the first pump should be interpreted as a respective first inlet of one of the first pumps. Correspondingly, the first outlet of the first pump should be interpreted as a respective first outlet of one of the first pumps. Also where the second pump comprises a plurality of pumps, references to the second inlet or the second outlet of the second pump should be interpreted as a respective second inlet or outlet of one of the second pumps.

Preferably the first outlet of the first pump is fluidly connected to a first abatement module, the second outlet of the second pump is fluidly connected to a second abatement module, and the reserve outlet of the reserve pump is selectively arranged in fluid communication with each of the first and second abatement modules.

Having each pump fluidly connected to a corresponding, dedicated abatement module allows each such abatement module to be optimised according to the nature of the process flow, e.g. deposition or cleaning process flow, which it has to handle.

Moreover, selectively fluidly connecting the reserve outlet of the reserve pump with each of the first and second abatement modules allows the reserve pump to stand in for either the first or the second pump while maintaining the aforementioned optimised abatement of the associated process flow.

According to a second aspect of the present disclosure there is provided fabrication assembly comprising: a plurality of process chambers; and a vacuum pumping arrangement including: one or more pumps connected for evacuating respective common pumping lines connected by valves to the process chambers and a reserve pump for reserving the one or more pumps dependent on their respective conditions and having a valved connection to at least one of the process chambers to allow evacuation of the chamber by the reserve pump independent of the one or more pumps.

In embodiments, the semiconductor fabrication tool shares the benefits associated with the corresponding feature of the vacuum pumping arrangement mentioned hereinabove.

BRIEF DESCRIPTION OF THE DRAWINGS

There now follows a brief description of preferred embodiments of the disclosure, by way of non-limiting example, with reference to the following figures.

DETAILED DESCRIPTION

Figure 1:
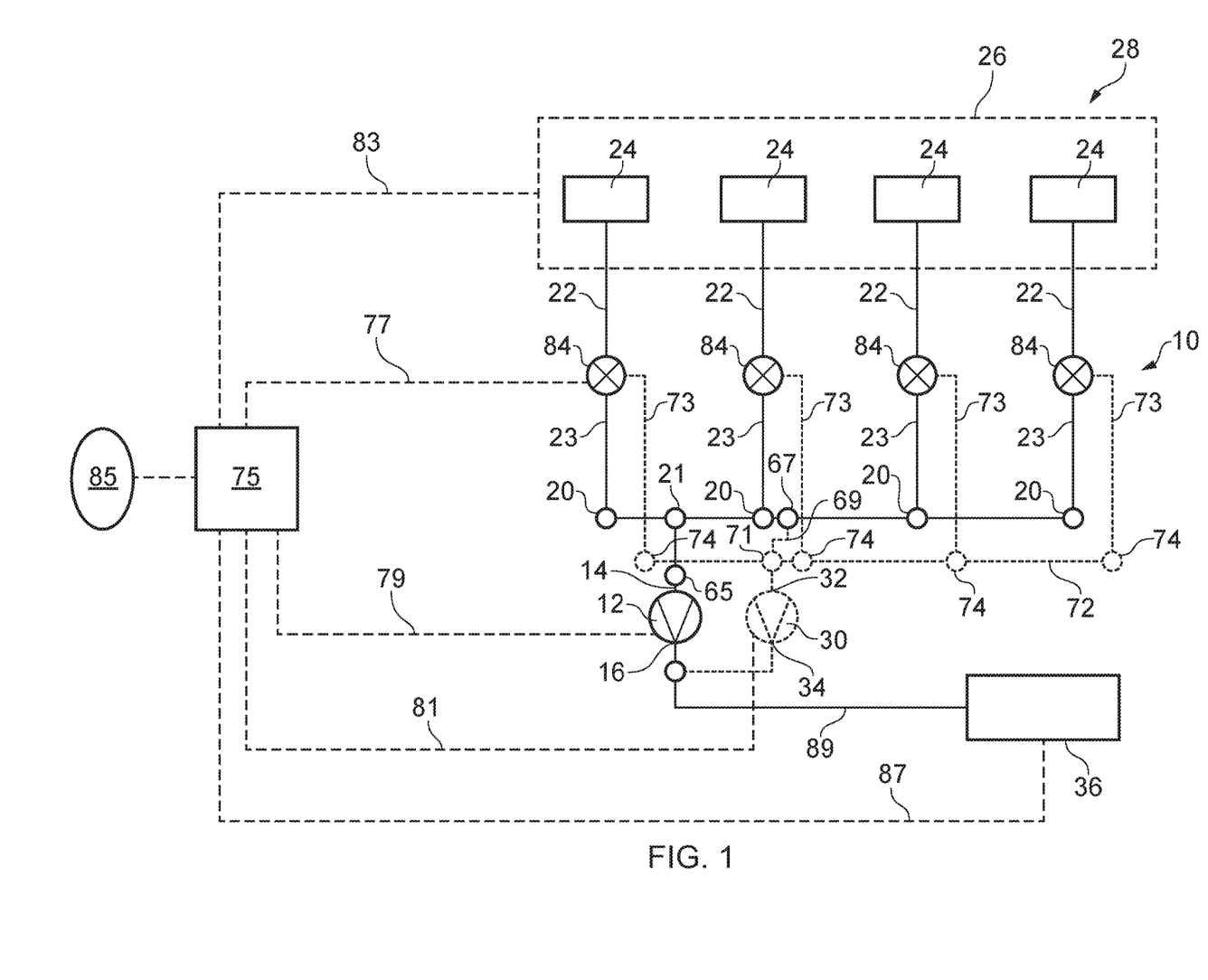
FIG. 1 shows a schematic view of a vacuum pumping arrangement according to a first embodiment of the disclosure.

A vacuum pumping arrangement according to a first embodiment is designated generally by reference numeral 10.

The vacuum pumping arrangement 10 includes a first pump 12. The term 'pump' in this application may refer to a single pump or more than one pump arranged together to co-operate for evacuating one or more chambers. For example, a single pump that exhausts to atmosphere; a combination of a booster pump and a compression pump; multiple pumps configured to operate in parallel; or a secondary pump and pump in series, such as a turbo molecular pump upstream of a roots-type pump, screw pump or scroll pump. In the case of turbo molecular pumps, each chamber is exhausted by a separate/respective turbo molecular pump with a common backing arrangement in the form of the first pump 12.

The pump 12 has a first inlet 14 and a first outlet 16. The first inlet 14 is fluidly connected to a first common pumping line 18 by a connection 21 to allow the pump to evacuate fluid from the pumping line. The first common pumping line includes a plurality of pumping line inlets 20. The first pumping line inlets 20 are, in use, fluidly connected by respective first pumping lines 23 and chamber connecting lines 22 to process chambers 24 within a group 26 of process chambers which together form part of a semiconductor fabrication tool 28. There are four inlets 20 and four connecting lines 22, 23 for four chambers 24 in this example, but there may be more than or fewer than four. By this arrangement the pump 12 can evacuate the common pumping line 18, which in turn causes evacuation of the plurality of chambers 24.

In the most typical arrangement, the common pumping line is evacuated to a desired pressure by the pump 12 and the chambers 24 are evacuated by the pumping line to the desired pressure, for example a pressure between about 1 mbar and $10^{-3}$ mbar. In other examples, differential pressure between chambers may be generated by one or more flow restrictions in the connecting lines or in the common pumping line.

Processing in the chambers is carried out at a desired pressure and the pump 12 is configured for evacuating the chambers to the desired pressure. But it is required intermittently or cyclically to increase the pressure of one or more of the chambers to a higher pressure or atmosphere, for example for maintenance, and then subsequently to reduce the one or more chambers to the desired pressure. It may also be the case that the pump 12 encounters a problem or failure that may cause a difficulty in maintaining a desired pressure in the common pumping line. Processing in the chambers may be compromised if the pressure were to rise significantly as a consequence of pumping problems or failure. Therefore, in the present arrangement, a reserve pump 30 is provided and shown in broken lines. The reserve pump is selectively fluidly connected to each process chamber 24 so that the reserve pump can, when required, evacuate one or more selected process chambers, thus "reserving" or providing a "back-up" to the first pump.

For example, if one or more process chambers are increased in pressure to atmosphere, the reserve pump is subsequently used to evacuate those chambers back to the desired pressure. Concurrently, by isolating the first pump from this particular process chamber, the first pump may be used to maintain a desired pressure in each of the other process chambers and processing is able to continue therein. In other cases, if the first pump encounters a problem or failure, the reserve pump can be used to maintain a desired pressure in the common pumping line. In some examples, the reserve pump may take on the pump-down function in relation to the group of process chambers 26 that is required to evacuate each of the process chambers from atmosphere to a desired pressure. This effectively relieves the first pump so that it need not incur the work or attrition required to perform that task. Advantageously, the first pump may, therefore, be configured for efficiently maintaining a pressure whereas the reserve pump is configured for rapidly reducing pressure in a pump-down scenario, for instance by inclusion of a booster pump for pumping relatively large volumes of fluid.

With regard to the present example, as illustrated in FIG. 1, the reserve pump 30 has a reserve inlet 32 and a reserve outlet 34. The reserve inlet 32 is connected for selectively evacuating any one or more of the process chambers 24. The reserve pump 30 may be connected for evacuating only one chamber, more than one chamber or all of the chambers in the group 26. The reserve inlet 32 is selectively connected to a reserve common pumping line 72 by a connection 71 to allow fluid communication with the reserve common pumping line.

In this example, the reserve common pumping line 72 includes four reserve pumping line inlets 74, each fluidly connected to respective process chambers 24 by reserve pumping lines 73 in combination with chamber connecting lines 22. Respective sets or pairs of first pumping lines 23, reserve pumping lines 73 and the chamber connecting lines 22 are connected to one another by respective valve modules 84. In the illustration, there is a reserve pumping line 73 associated with each chamber connecting line 22 so that the reserve pump 30 can be selectively connected to any one of the plurality of process chambers 24. In other examples it may be required that fewer than all of the process chambers 24 are connectable for evacuation by the reserve pump 30.

Additionally, the reserve pump 30 can be connected to the process chambers 24 through the first common pumping line 18. The reserve pump 30 is connected to the first common pumping line by a connecting line 69 and a valve module 67 so that the reserve pump 30 can selectively evacuate the first common pumping line 18. Concurrently, the reserve pump 30 would be isolated from the reserve pumping line 72 by actuating valve connection 71.

If the first pump 12 fails, an inlet valve 65 can be closed to isolate the first pump 12 from the first common pumping line 18. The first pump 12 can then be replaced or repaired whilst the reserve pump 30 takes over process pumping for all of the process chambers 24. An advantage of this arrangement is that pressure fluctuation in the process chambers 24 is reduced when the reserve pump 30 is introduced via the first common pumping line 18 compared to diverting gas to the reserve pump via reserve pumping lines 73 by controlling valve modules 84. In this regard, the first common pumping line 18 is maintained at the required process pressure and its internal volume acts as a buffer to absorb, at least partially, any pressure difference experienced due to the reserve pump inlet 32 being at a different pressure. In contrast, if the reserve pump 30 were to take over the process pumping for the process chambers 24 via the reserve pumping lines 72, 73 then there would be a delay (or a pressure fluctuation) whilst these lines were evacuated down to process pressures. Furthermore, these lines, previously only used for pump-down and thus exposed to relatively clean fluids, would be contaminated by the process fluids that are normally conveyed through the process lines 18, 22.

Where the first pump 12 is provided by a number of pumping units, the reserve pump 30 may be used to "reserve" an individual pumping unit that is experiencing a failure condition. Thus the reserve pump 30 may be used to address/mitigate fluctuations in capacity/performance of the first pump 12.

The valve modules 84 are arranged for selectively conveying fluid from the process chambers 24 along chamber connecting lines 22 and the first pumping lines 23 to the first common pumping line 18 or along chamber connecting lines 22 and the reserve pumping lines 73 to the reserve common pumping line 72. In this way, either the first common pumping line 18 and first pump 12 or the reserve common pumping line 72 and the reserve pump 30 are isolated from the respective pumping chambers 24. Any one or more of the valve modules 84 can be activated to convey or isolate fluid flow as required.

The valve modules 84 may comprise a three-way valve or two two-way valves connected in series or alternative arrangements, as required.

A controller 75 (shown schematically) is configured for selectively fluidly isolating the first pump 12 from one or more of the process chambers 24 and selectively fluidly connecting the reserve pump 30 with the, or each, corresponding process chamber 24. Conversely, following a completed operation by the reserve pump 30 the controller 75 is configured for isolating the reserve pump 30 from and re-connecting the first pump 12 to the, or each, process chamber 24.

In the illustrated example, the controller 75 is shown with dashed control lines 77 connecting it to the valve modules 84 for transmitting control signals for controlling the valves. When it is required to switch fluid flow between the first pump 12 and the reserve pump 30, the controller controls valves 84 to convey fluid from chamber connecting line 22 to the reserve common line 72 and, thus, to reserve pump inlet 32. The controller 75 is configured to control any one or more of the valves 84 to divert flow from any one or more associated process chambers 24 to the reserve pump 30 whilst isolating the first pump 12 from the associated chamber or chambers. The first pump 12 continues to be connected to the other or others of the chambers 24 for evacuation.

The controller 75, in this example, is connected by a control line 79 at least for receiving a signal from the first pump 12 indicating an operating condition of the pump. If a failure condition is experienced by the first pump 12, the controller 75 controls the valves 65, 67, 71 to divert flow from any one or more chambers 24 to the reserve pump 30 via the first common pumping line 18. This arrangement allows the desired pressure in the process chambers 24 to be maintained independent of a condition of the first pump 12.

In most cases the reserve pump 30 is operated in a condition so that it can be brought on line as soon as it becomes necessary to do so. In the case of a pump-down, the reserve pump 30 can be used to pre-evacuate the reserve common pumping line 72 and the reserve pumping lines 73 so that when it becomes necessary to evacuate a chamber, the pressure in these lines is already reduced. Upon actuation of valve module 84, fluid connection between the chamber 24 and the reserve pump is achieved. The reduced pressure in the lines 72, 73 causes an immediate reduction in chamber pressure as the pressure of the chamber 24 equalises with the pressure in the lines 73, 72. In the case of a reserve or back-up scenario, by operating the reserve pump 30 at ultimate (for example), if the first pump 12 experiences a failure condition, the reserve pump 30 is already operating and can be isolated from the reserve line 72 and connected directly to the first common pumping line 18 as the first pump 12 is isolated therefrom. Alternatively, the reserve pump 30 may be operated in a condition, such as an idle mode, until it is required.

The controller 75 may be connected to the reserve pump 30 by a control line 81 for sending a control signal to the reserve pump for activating a condition for evacuation, particularly when such a required condition is anticipated by the system in advance of the requirement.

In this embodiment, the controller is connected by a control line 83 to the fabrication tool 28 for receiving or transmitting signals. In the event that it is required to perform maintenance (or otherwise increase pressure) on any one or more process chambers 24 the fabrication tool 28 may be configured to transmit an appropriate signal identifying which one or more process chambers 24 will be raised to a higher pressure or atmosphere. When received, the controller 75 controls one or more of the valves 84 to isolate the first pump from the one or more chambers. The fabrication tool 28 may sense when a chamber 24 is increased in pressure or it may include a human user interface operated by an operator for initiating a maintenance event or other action which causes a pressure increase. In another example, the controller 75 comprises a human user interface for operation by an operator prior to initiating a maintenance event or other action which causes a pressure increase in one or more chambers.

During such operation, having one or more process chambers 24 at increased pressure, the controller 75 may, additionally, inform the semiconductor fabrication tool 28 that the reserve pump 30 is in operation and that, therefore, a reduced functionality mode should be adopted, e.g. none of the process chambers 24 should be expected to be pumped down from atmospheric pressure while processing continues in each of the other process chambers 24. Furthermore, the controller 75 may send a similar indication, i.e. that a reduced functionality mode should be adopted, if a fault with the reserve pump is preemptively detected as there will not be capacity to perform a pump-down function.

Following the service and/or repair of the first pump 12 the controller re-connects the first pump 12 and again fluidly isolates the reserve pump 30 from the process chamber 24.

In another example, especially where the first pump 12 is provided by a plurality of pumping units, the reserve pump 30 can act as a partial back up for the first pump 12, whereby the evacuation provided by the first pump is at least partially supplemented by the evacuation provided by the reserve pump 30, so that for example in periods of high load on the first pump 30 or where one of the pumping units is experiencing a failure condition, the reserve pump 30 can be operated additionally to share the load.

As described above, the first pump 12 may be operated under low load conditions, for example to maintain a desired pressure, but pump-down from a high pressure to a low pressure is performed by the reserve pump 30. In this case, the first pump 12 may be generally configured for maintaining a desired pressure over prolonged durations and be less suitable for pump-down than the reserve pump 30, which is configured for the higher capacity pump-down operations. In these cases, the controller 75 controls the pumping arrangement to cause the reserve pump 30 to operate in addition to the first pump 12 for load-sharing or to operate instead of the first pump 12 when a pump-down of any one or more of the chambers 24 is required.

The controller 75 may be connected to parts of the pumping arrangement by wired control lines or may communicate with wireless control lines. The controller 75 may be physically or proximate to these parts or could be located distant therefrom such as at a control centre.

Semi-conductor fabrication tools 28 are used to perform a number of different processes, such as deposition, etching or cleaning. The process gases required for such processes when evacuated from the chambers 24 require abatement. Abatement causes the process gases to be made more manageable for storage or disposal.

An abatement device 36 is connected for fluid transfer from the exhausts, or pump outlets, 16, 34 of the first pump 12 and the reserve pump 30. A first common abatement line 89 connects the abatement device 36 to the exhausts. In this embodiment, the abatement device 36 is arranged to abate the, or each, of the process gases used in the process chambers 24 and exhausted by either the first pump 12 or the reserve pump 30, regardless of which of the pumps 12, 30 is used to evacuate the chambers 24. There may be selective connection between the reserve pump 30 and the abatement device 36 for example to avoid mixing of pump-down gases and process gases.

The controller 75 in this example is connected to the abatement device, or module, 36 by a control line 87 so that the abatement device can be operated in response to a condition of the system, for example in a burner a flammable gas may be input to the burner only when the controller determines that process gas has been evacuated by the first pump 12 or the reserve pump 30 that requires abatement.

Figure 2:
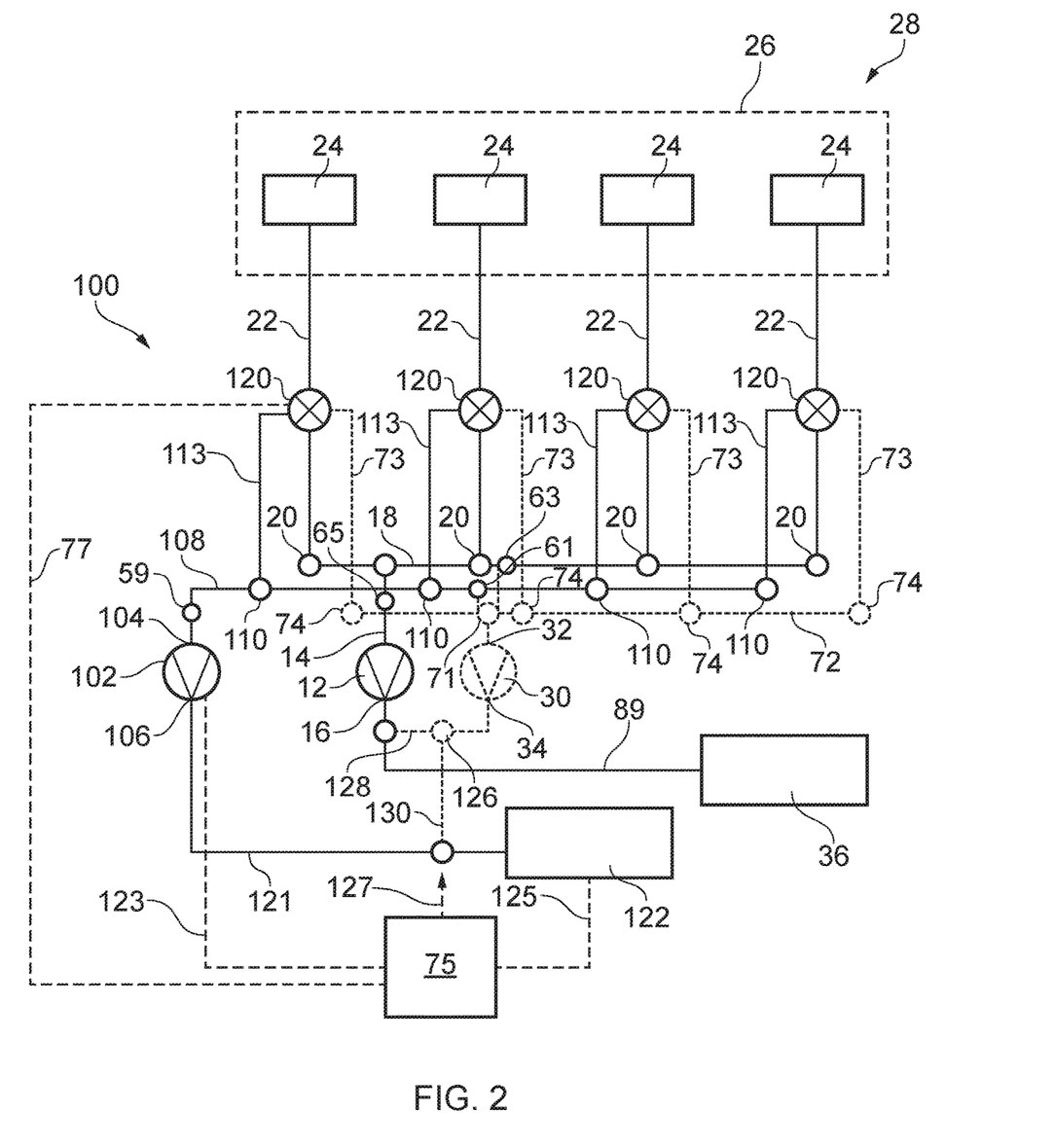
FIG. 2 shows a schematic view of a vacuum pumping arrangement according to a second embodiment of the disclosure.

If a plurality of processing steps (including a clean step) are performed in the process chambers 24 requiring different processing fluids it may be required that a plurality of main pumps are used for pumping the different fluids and that more than one abatement module is used for abating different fluids. Additionally a reserve pump 30 may be required for reserving at least two or all of the plurality of main pumps. FIG. 2 shows one example of such an implementation.

Referring to FIG. 2, a schematic view is shown of a vacuum pumping arrangement 100 according to a second embodiment. The second vacuum pumping arrangement 100 is similar in many respects to the first vacuum pumping arrangement 10, and like features share the same reference numerals where appropriate, and will not be described in detail again unless required specific to the FIG. 2 implementation.

The second vacuum pumping arrangement 100 includes a first pump 12 having a first inlet 14 and a first outlet 16. The first inlet 14 is fluidly connected to a first common pumping line 18 which includes a plurality of first pumping line inlets 20. In use, the first pumping line inlets 20 are fluidly connected to respective process chambers 24 within a group of process chambers 26 that together form a semiconductor fabrication tool 28.

In addition, and in differentiation from the first embodiment, there is provided a second pump 102 which has a second inlet 104 and a second outlet 106. The second inlet 104 is fluidly connected to a second common pumping line 108 which has a plurality of second pumping line inlets 110. The second pumping line inlets 110 are, in use, fluidly connected to respective process chambers 24 within the aforementioned group of process chambers 26 via the second common pumping line 108, the second pumping lines 113 and the chamber connecting lines 22. In most cases, fluid is conveyed along the first or second pumping lines 23, 113 dependent on the process that is performed in a process chamber 24 at a required process pressure and the gas that is used for processing. For example, the first and second pumps 12, 102 may be configured to pump at different pressures or one of the pumps may be configured for pumping a more corrosive gas than the other pump.

A reserve pump 30 has a reserve inlet 32 and a reserve outlet 34. The reserve inlet 32 is fluidly connected to a reserve common pumping line 72 which has a plurality of reserve pumping line inlets 74, which are, in use, selectively fluidly connected to respective process chambers 24. The reserve pump 30 is used similarly to the first embodiment, except that in this embodiment, it is able to serve as a reserve pump for the second pump 102 as well as the first pump 12.

Therefore, each of the process chambers 24 may be caused to evacuate by the first pump 12, the second pump 102 or the reserve pump 30 via the first common pumping line 18, the second common pumping line 108 or the reserve common pumping line 72, respectively.

As shown, respective sets or trios of first, second, and reserve pumping line inlets 20, 110, 74 are fluidly interconnected by a valve module 120 which, in turn, is fluidly connected to a corresponding process chamber 24 by a chamber connecting line 22. The valve modules 120 are modified from the valve modules 84 to control fluid flow from the chambers along any of three paths rather than two paths in the first embodiment. In this way, flow along two of the paths may be resisted or isolated as flow is conveyed along a third path. The second pumping lines 113 constitute one such path from the valve modules 120 towards the second common pumping line 108 and the second pump 102.

Typically a first pump 12 or a second pump 102 is used for evacuating any one or more of the chambers 24 dependent on the pressure required and the process fluid evacuated so that different processes can be performed at the same time in different chambers 24 or one process after another in one chamber. Different process fluids (e.g. for deposition, etching or clean steps) often require different abatement techniques and therefore, in this embodiment, a second abatement module 122 is provided for abating one or more second fluids exhausted by the second pump 102 that require different abatement to fluid exhausted by the first pump 12. The abatement modules 36, 122 may be, for example, a burner and a wet scrubber or two burners having different abatement characteristics or a plasma-based device and a flame-based device. In other examples (not illustrated) the process gases exhausted from both the first and second pumps can be treated by a single abatement module.

As shown, the outlet 106 of the second pump is connected to the second abatement module 122 by a second common abatement line 121 for conveying fluid from the second pump 102 to the second abatement module 122.

The reserve pump 30 functions as a reserve for the second pump 102 in the same way as described above for the first pump 12. By actuating valves 61 and 63 the reserve pump 30 can be concurrently isolated from the reserve common pumping line 72 and connected to the second common pumping line 108. Meanwhile, the second pump 102 is isolated from the second common pumping line 108 by actuating inlet valve 59.

The reserve pump 30, in this embodiment, is selectively connected for exhausting fluid to the second common abatement line 121 in addition to the first abatement line 89 dependent on whether it is functioning as a reserve for the second pump 102 or the first pump 12. In this example, the outlet 34 of the reserve pump 30 is connected downstream to a valve 126 for conveying fluid selectively to one of the first common abatement line 89 along connecting line 128 or the second common abatement line 121 along connecting line 130.

The second vacuum pumping arrangement 100 comprises a controller 75, which is explained above in relation to the first embodiment. One or more of the aspects of the controller that are described above may be included for the controller in the second embodiment but, for the simplicity of FIG. 2, these have not be shown again in the illustration and will not be described further, unless specifically appropriate to the FIG. 2 embodiment.

The controller 75 is configured to selectively fluidly isolate each of the first and second pumps 12, 102 from one or more given process chambers 24, and selectively fluidly connect the reserve pump 30 with the said one or more given process chambers 24. In this way, the reserve pump 30 can act as reserve for either the first or the second pump 12, 102 in the same way that it acts as a reserve for the first pump 12 in the first embodiment and its modifications.

As shown in the FIG. 2 example, the controller 75 is additionally connected by a control line 123 to the second pump 102 for controlling operation of the second pump and to valve modules 120 by control line 77 for transmitting signals from or to the controller and operates to control the valve modules 120 so that fluid is conveyed from process chambers 24 to selected pumps 12, 120, 30. The controller is connected by a control line 127 to the valve 126 so that the controller can control connection of the exhaust 34 of the reserve pump to either one of the abatement modules 36 or 122 dependent on the process gas evacuated by the reserve pump that requires abatement. In this example the controller is connected by a control line 125 to the abatement module 122 in addition to the abatement module 36 for activating the module when abatement is required.

During normal operation of each of the first and second pumps 12, 102 the reserve pump 30 is standing by to take over from either the first or second pump 12, 102 and may, in such a standby mode, be run "hot" so as to require minimal cooling water, and also with a minimum degree of purge gas, e.g. nitrogen, flowing therethrough, so as again to minimise running costs.

In the case where there is more than one main pump (two main pumps in FIG. 2) and a reserve pump, predictive diagnostics can be used to predict or anticipate a reduction in performance or failure of one of the main pumps and to pre-condition the reserve pump for providing reserve pumping for the appropriate main pump.

As illustrated the controller 75 is arranged to receive an output from the first pump 12 by connection along control line 79 and an output from the second pump 102 by connection along control line 123. The output from the pumps corresponds to an operative condition of the pumps and may include such parameters as current draw or vibration. The controller determines if the received parameters indicate a loss of performance or potential failure and outputs a pre-conditioning signal to the reserve pump 30 along control line 81 to pre-condition the reserve pump for reserve pumping in place of the appropriate main pump.

Pre-conditioning causes the reserve pump 30 to match the optimal conditions for reserving the appropriate main pump 12, 120. When two processes are performed in the process chambers 24, the main pumps may have different and incompatible respective pumping requirements. For example, an etch process may require a cold pump and a deposition process may require a hot pump or pumping may require different purge gas flows. In this way, predictive diagnostics can prepare the reserve pump 30 for the required pumping in place of the appropriate main pump.

In operation of the fabrication tool 28, there are typically different processing steps performed one after another in the chambers 24. A first step may be performed in all of the chambers 24 followed by a second step, or different steps may be performing in different chambers 24 at the same time. Dependent on the step performed there are different pumping requirements (e.g. pressure or capability of pumping a particular gas, or purge gas requirements) and different abatement requirements for abating gases.

In the event of failure or required maintenance of the first pump 12, for example during a deposition step, the controller fluidly isolates the first pump 12 and instead fluidly connects the reserve pump 30 to one or each of the process chambers 24 via the first common pumping line 18. The reserve pump 30 thereafter takes the place of the first pump 12 while the deposition processes continue within one or each process chamber 24. To this end the controller arranges the reserve outlet 34 of the reserve pump 30 in fluid communication with the first abatement module 36 so that the first abatement module 36 is able to remove undesirable deposition process flow constituents from the exhaust flow of the reserve pump 30.

In the example shown, the reserve pump 30 can be connected to the process chambers 24 through the first common pumping line 18 or the second common pumping line 108. The reserve pump 30 is connected to the first common pumping line by a valve module 63 so that the reserve pump can selectively evacuate the first common pumping line. The reserve pump 30 is also selectively connected to the second common pumping line 108 by a valve module 61 so that the reserve pump can selectively evacuate the second common pumping line 108.

If the first pump 12 fails, an inlet valve 65 can be closed to isolate the first pump from the first common pumping line 18. The first pump can then be replaced or repaired whilst the reserve pump 30 takes over pumping for all of the process chambers 24. If the second pump fails 102 an inlet valve 59 can be closed to isolate the second pump from the second common pumping line 108. The second pump can then be replaced or repaired whilst the reserve pump 30 takes over pumping for all of the process chambers 24.

An advantage of this arrangement is that pressure fluctuation in the process chambers 24 is reduced when the reserve pump 30 is introduced compared to diverting gas to the reserve pump by controlling valve modules 120. In this regard, the first and second common pumping lines 18, 108 are maintained at respective required process pressures and their internal volumes act as buffers to absorb at least partially the pressure difference if the reserve pump 30 inlet is at a different pressure.

When the first pump 12 has been replaced or repaired the controller reintroduces the first pump 12 into fluid communication with one or each of the process chambers 24 and the first abatement module 36, and isolates the reserve pump 30 from the process chambers 24 and the first abatement module 36. In this manner the first pump 12 resumes pumping of the deposition process flows within the process chambers 24 and the first abatement module 36 continues to remove undesirable constituents from the exhaust of the first pump 12.

Following completion of a given deposition process step the semiconductor fabrication tool switches to running another process step (e.g. a cleaning process step) within one or more of the process chambers 24. During such a cleaning process step the second pump 102 and associated second common pumping line 108 would normally handle the cleaning process flow.

In the event of failure or required maintenance of the second pump 102, the controller arranges the reserve pump 30 and second common pumping line 108 in fluid communication with the, or each, process chamber 24 undergoing a cleaning process step, and the reserve outlet 34 of the reserve pump 30 is arranged in fluid communication with the second abatement module 122.

When the second pump 102 has been replaced or repaired the controller may reintroduce the second pump 102 into fluid communication with one or each of the process chambers 24 and isolate the reserve pump 30 from the process chambers 24 and the first abatement module 36.

In operation of the fabrication tool 28, there may a requirement to increase the pressure in one or more chambers 24 to atmosphere and then, subsequently, reduce (or pump-down) the pressure to a desired or processing pressure. The controller 75 is configured to connect the reserve pump 30 to one or more chambers 24 that require evacuation from atmosphere to the desired pressure and isolate the first and second pumps 12, 102 from the one or more chambers. Since the reserve pump 30 is infrequently used as a back-up for the first or the second pump 12, 102 it incurs comparatively little degradation from back-up use and can, therefore, perform chamber pump-down without significant overall degradation. Thus it is available to spare the first and second pumps from the degradation incurred by pump-downs. Additionally the first and second pumps 12, 102 can be optimised for a specific process, rather than compromising their main purpose by also requiring that they are configured for pump-downs. Some compromise is acceptable for the reserve pump 30 because it only acts as reserve for maintaining pressure for relatively short periods required for repairing or replacing the first or second pump 12, 102.

In another arrangement, the reserve pump 30 is selectively fluidly connected to a chamber 24 that is not selectively fluidly connected to the first pump in the first embodiment or either the first pump or the second pump in the second embodiment.

The invention claimed is:

1. A vacuum pumping arrangement for evacuating a plurality of process chambers of a fabrication assembly, comprising:
   a first pump having a first inlet and a first outlet, the first inlet being selectively, fluidly connected to a first common pumping line, the first common pumping line including a plurality of first pumping line inlets, each first pumping line inlet being fluidly connectable to a process chamber within a group of process chambers forming the fabrication assembly;
   a reserve pump having a reserve pump inlet and a reserve pump outlet, the reserve pump inlet of the reserve pump being selectively fluidly connected to a reserve common pumping line, the reserve common pumping line including a plurality of reserve pumping line inlets, each reserve pumping line inlet being selectively fluidly connectable to a process chamber,
   thereby forming respective sets of first and reserve pumping line inlets interconnected by a valve module which, in turn, is fluidly connectable to at least one process chamber;
   a first fluid connection between the first common pumping line and the reserve pump inlet; and
   a controller configured to:
      selectively, fluidly connect each of the first pump and the reserve pump with the, or each, process chamber,
      selectively fluidly connect the reserve pump to the first common pumping line, and
      connect the first common pumping line with the reserve pump inlet of the reserve pump by the first fluid connection, depending on the condition of the first pump.

2. The vacuum pumping arrangement as claimed in claim 1, wherein the controller is configured to connect a selected process chamber with the first pump or the reserve pump via the sets of first and reserve pumping line inlets, dependent on the pumping requirement of the selected process chamber.

3. The vacuum pumping arrangement as claimed in claim 1, wherein the first fluid connection is a valved fluid connection between the first and reserve common pumping lines and the controller is configured to connect the first and reserve common pumping lines depending on the condition of the first pump.

4. The vacuum pumping arrangement according to claim 1, wherein the first outlet of the first pump is fluidly connected to a first abatement module and the reserve pump outlet of the reserve pump is selectively arranged in fluid communication with the first abatement module.

5. The vacuum pumping arrangement as claimed in claim 1, further comprising:
   a second pump having a second inlet and a second outlet, the second inlet being fluidly connected to a second common pumping line, the second common pumping line including a plurality of second pumping line inlets, each second pumping line inlet being fluidly connectable to at least one process chamber within the group of process chambers forming the fabrication assembly;
   wherein respective sets of first, second and reserve pumping line inlets are fluidly interconnected by a valve module which, in turn, is fluidly connectable to a respective process chamber of the at least one process chamber;
   a second fluid connection between the second common pumping line and the reserve pump inlet; and
   wherein the controller is configured to selectively, fluidly connect each of the first pump, the second pump and the reserve pump with the, or each, process chamber, and to selectively fluidly connect the reserve pump to the second common pumping line.

6. The vacuum pumping arrangement as claimed in claim 5, wherein the controller is configured to connect a selected process chamber with the first, second or reserve pumps by the sets of first, second and reserve pumping line inlets dependent on the pumping requirement of the selected process chamber.

7. The vacuum pumping arrangement as claimed in claim 5, wherein the controller is configured to connect the respective first or second common pumping line with the reserve pump inlet of the reserve pump by the respective first and second fluid connections, depending on the condition of the first or second pumps.

8. The vacuum pumping arrangement as claimed in claim 7, wherein the second fluid connection is a valved fluid connection between the second and reserve common pumping lines and the controller is configured to connect the second and reserve common pumping lines depending on the condition of the second pump.

9. The vacuum pumping arrangement according to claim 5, wherein the second outlet of the second pump is fluidly connected to a first abatement module, and the reserve outlet of the reserve pump is selectively arranged in fluid communication with the first abatement module.

10. The vacuum pumping arrangement according to claim 5, wherein the second outlet of the second pump is fluidly connected to a second abatement module, and the reserve outlet of the reserve pump is selectively arranged in fluid communication with the second abatement module.

11. The vacuum pumping arrangement according to claim 5, wherein the controller is configured to predict a failure condition of one of the first and second pumps.

12. The vacuum pumping arrangement according to claim 11, wherein the controller is configured to pre-condition the reserve pump to approximate the operating conditions of the pump that is experiencing failure.

13. A fabrication assembly comprising:
   a plurality of process chambers; and
   a vacuum pumping arrangement including:
      a first pump having a first inlet and a first outlet, the first inlet being selectively, fluidly connected to a first common pumping line, the first common pumping line including a plurality of first pumping line inlets, each first pumping line inlet being fluidly connectable to a process chamber within a group of process chambers forming the fabrication assembly;
      a reserve pump having a reserve pump inlet and a reserve pump outlet, the reserve pump inlet of the reserve pump being selectively fluidly connected to a reserve common pumping line, the reserve common pumping line including a plurality of reserve pumping line inlets, each reserve pumping line inlet being selectively fluidly connectable to a process chamber,
      thereby forming respective sets of first and reserve pumping line inlets interconnected by a valve module which, in turn, is fluidly connectable to at least one process chamber;
      a first fluid connection between the first common pumping line and the reserve pump inlet; and a controller configured to:
selectively, fluidly connect each of the first pump and the reserve pump with the, or each, process chamber,
selectively fluidly connect the reserve pump to the first common pumping line, and
connect the first common pumping line with the reserve pump inlet of the reserve pump by the first fluid connection, depending on the condition of the first pump.

14. A fabrication assembly comprising a vacuum pumping arrangement comprising:
a first pump having a first inlet and a first outlet, the first inlet being selectively, fluidly connected to a first common pumping line, the first common pumping line including a plurality of first pumping line inlets, each first pumping line inlet being fluidly connectable to a process chamber within a group of process chambers forming such a fabrication assembly;
a second pump having a second inlet and a second outlet, the second inlet being fluidly connected to a second common pumping line, the second common pumping line including a plurality of second pumping line inlets, each of which is second pumping line inlet being fluidly connectable to at least one process chamber within the group of process chambers forming such a fabrication assembly;
wherein respective sets of first, second and reserve pumping line inlets are fluidly interconnected by a valve module which, in turn, is fluidly connectable to a respective process chamber of the at least one process chamber;
a reserve pump having a reserve pump inlet and a reserve pump outlet, the reserve pump inlet of the reserve pump being selectively fluidly connected to a reserve common pumping line, the reserve common pumping line including a plurality of reserve pumping line inlets, each reserve pumping line inlet being selectively fluidly connectable to a process chamber,
thereby forming respective sets of first and reserve pumping line inlets interconnected by a valve module which, in turn, is fluidly connectable to at least one process chamber;
a first fluid connection between the first common pumping line and the reserve pump inlet;
a second fluid connection between the second common pumping line and the reserve pump inlet; and
a controller configured to selectively, fluidly connect each of the first pump, the second pump, and the reserve pump with the, or each, process chamber, to selectively fluidly connect the reserve pump to the first common pumping line, and to selectively fluidly connect the reserve pump to the second common pumping line.

15. The fabrication assembly as claimed in claim 14, wherein the controller is configured to connect a selected process chamber with the first pump or the reserve pump via the sets of first and reserve pumping line inlets, dependent on the pumping requirement of the selected process chamber.

16. The fabrication assembly according to claim 14, wherein the first outlet of the first pump is fluidly connected to a first abatement module and the reserve pump outlet of the reserve pump is selectively arranged in fluid communication with the first abatement module.

17. The fabrication assembly according to claim 14, wherein the controller is configured to predict a failure condition of one of the first and second pumps.

18. The fabrication assembly according to claim 17, wherein the controller is configured to pre-condition the reserve pump to approximate the operating conditions of the pump that is experiencing failure.

* * * * *